United States Patent [19]

Powell

[11] Patent Number: 5,202,636
[45] Date of Patent: Apr. 13, 1993

[54] METHOD OF NON-DESTRUCTIVE LAMP TESTING BY SENSING LIGHT OUTPUT

[75] Inventor: Robert A. Powell, Cookeville, Tenn.

[73] Assignee: Cooper Industries, Inc., Houston, Tex.

[21] Appl. No.: 658,939

[22] Filed: Feb. 22, 1991

[51] Int. Cl.$^5$ .............................................. G01R 31/00
[52] U.S. Cl. .................................. 324/414; 324/403; 324/501; 340/641
[58] Field of Search .................. 324/403, 414, 501; 250/551; 340/641, 626, 619; 356/218

[56] References Cited

U.S. PATENT DOCUMENTS 3,399,348  8/1968  Praglin et al. ................ 250/551 X
3,626,194 12/1971  Kirano et al. ................ 250/551 X Primary Examiner—Gerard R. Strecker
Assistant Examiner—Diep Do
Attorney, Agent, or Firm—Eddie E. Scott; Alan R. Thiele

[57] ABSTRACT

A system for testing electrical lamps includes a hollow cylinder. Lamps are placed in the hollow cylinder and the light emitted from the lamp is focused onto a phototransistor by a focusing lens. The output of the phototransistor is measured against the electrical voltage input into the lamp. If the output of the phototransistor lags behind the input voltage to the lamp by more than a predetermined amount, the lamp is rejected.

1 Claim, 2 Drawing Sheets

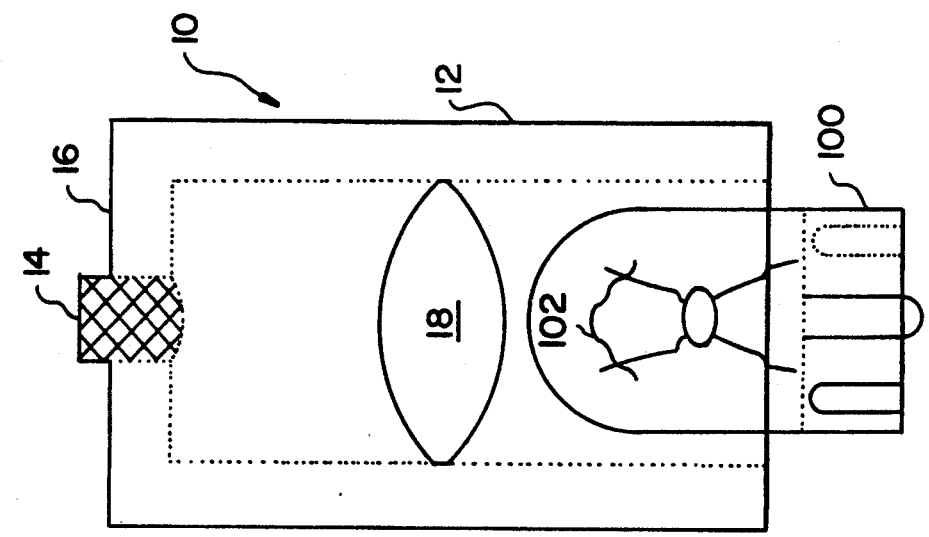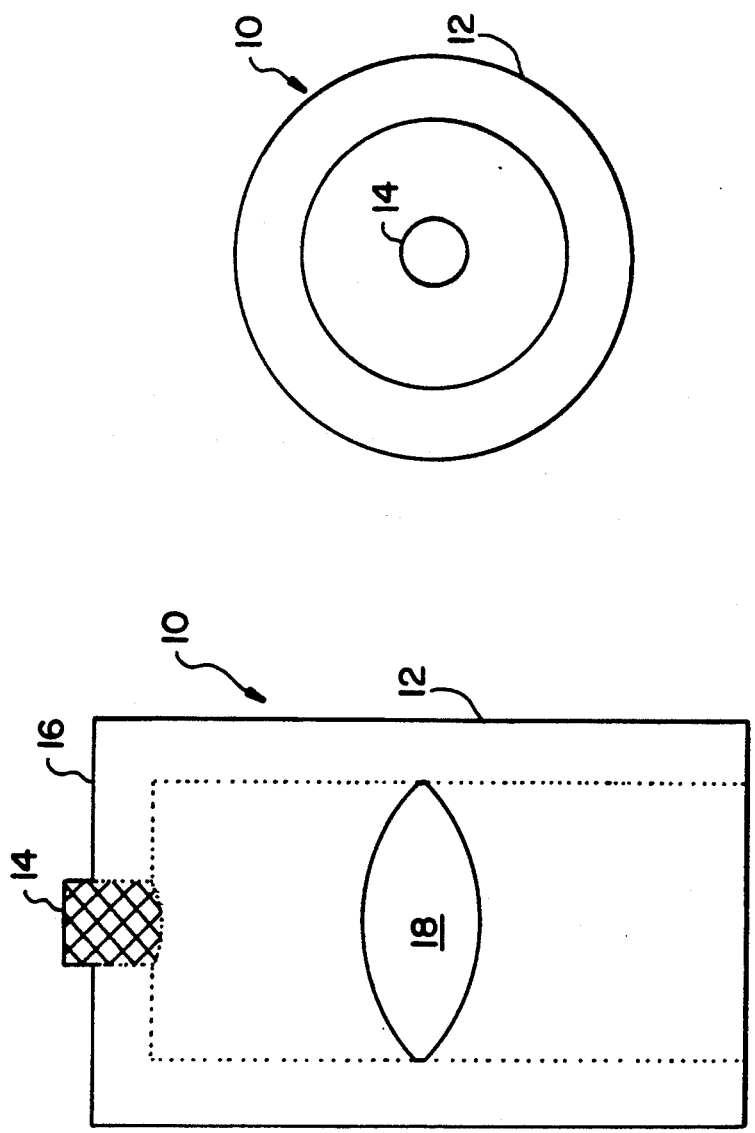

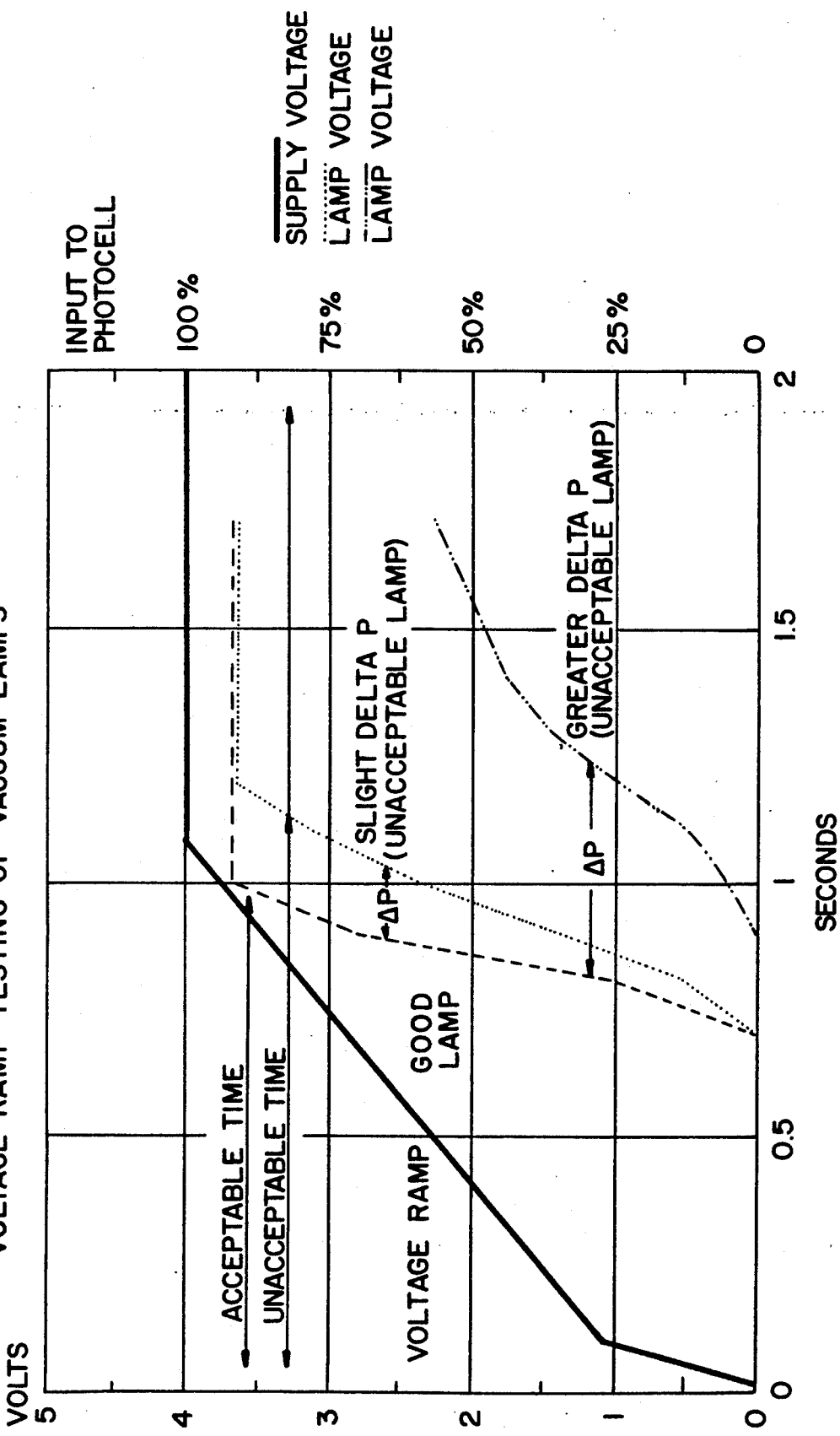

METHOD OF NON-DESTRUCTIVE LAMP TESTING BY SENSING LIGHT OUTPUT

BACKGROUND OF THE INVENTION

The present invention pertains to lamp testing systems; more particularly, the present invention pertains to a system for non-destructive pressure testing of incandescent lamps.

Most incandescent lamps are produced with an evacuated internal atmosphere. Essentially, the internal atmosphere is at a relative vacuum because the air pressure within the lamp is quite low with respect to atmospheric air pressure. If during or after the manufacturer of the lamp a leak develops or the internal components of the lamp become contaminated, the air pressure within the lamp will increase. This increased pressure can cause the lamp to have a shorter life span or worse turn dark so the light output is reduced.

There is no effective method of testing lamps other than providing the lamp with operating current at the prescribed voltage and then letting the lamp operate for several minutes to determine whether or not a darkening of the lamp occurs. Such testing is time-consuming and reduces the life of the lamp.

There is, therefore, a need in the art to provide a system whereby incandescent lamps can be tested in a rapid manner and those lamps in which an overpressured condition exists can be easily and quickly identified.

SUMMARY OF THE INVENTION

A testing fixture for incandescent lamps includes a cylinder which fits over the electrical lamp. Located in the cylinder is a focusing lens which causes the light emitted by the electrical lamp to impinge upon a phototransistor. The light output from the electrical lamp is then measured by the electrical output of the phototransistor. The electrical output of the phototransistor is compared to the voltage applied to the lamp. Those lamps whose increase in light output lags behind the increase in voltage applied to the lamp at more than a predetermined value are rejected.

BRIEF DESCRIPTION OF THE DRAWINGS

A better understanding of the electrical lamp testing fixture of the present invention may be had by reference to the drawings wherein:

FIG. 1 is a schematic cross-sectional view of the fixture of the present invention;

FIG. 1A is a bottom view of the fixture shown in FIG. 1;

FIG. 2 is a cross-sectional view of the fixture of the present invention containing an electrical lamp;

FIG. 3 is a representative graph showing the comparison of the increase in lamp voltage to the increase in light output.

BRIEF DESCRIPTION OF THE EMBODIMENTS

It may be seen by reference to FIGS. 1, 1A and 2 that the non-destructive lamp testing system of the present invention 10 includes a substantially cylindrical tube 12 and is placed over a lamp 100. In the preferred embodiment tube 12 is made of nylon. Tube 12 contains a phototransistor 14 at one end 16 and a focusing lens 18 in its midst. The focusing lens 18 and phototransistor 14 are all for the detection of a small amount of light emitted from the lamp 100 being tested. Ideally, the cylindrical tube 12 and the focusing lens 18 are adjustable to accommodate different size lamps.

While lamp 100 is in test fixture 10, a voltage is supplied to the lamp filament 102. The supply voltage is ramped up to approximately 30 percent of the design voltage of lamp 100. At a point in time after the supply voltage has been started, the output of phototransistor 14 also starts to ramp up. The output of phototransistor 14, however, lags the input voltage to lamp 100 as may be seen by reference to FIG. 3. Lamps which have a defect such as an overpressured internal atmosphere evidence a light output which significantly lags the supply voltage to lamp 100. (See Delta P) Such lag generally indicates that the pressure in the internal atmosphere is at an acceptable level. It has been noticed that the condition of excess lagging of light output against input voltage is most pronounced just prior to run-up of supply voltage.

The electronics connected to the phototransistor and the lamp supply measure the time difference along about 80% of the test voltage ramp. Any lamp having an increased lag time is determined to be not acceptable.

It has been noticed that the phenomenon of increased light output lag time occurs when the filament 102 just starts to glow. This lag in voltage can be attributed to heat loss in the filament 102 due to energy absorption by the increased number of molecules present within the lamp atmosphere.

There is thereby provided by the testing fixture and method of the present invention 10 a method for non-destructive testing of electric lamps.

It will be understood by those of ordinary skill in the art that various modifications of the disclosed testing fixture and method may be made without departing from the scope of the present invention.

I claim:

1. A method for testing an electrical lamp comprising the steps of:

supplying a voltage to an electrical lamp;

focusing the light output from said electrical lamp on a photo transistor;

measuring the voltage output of said photo transistor;

measuring the supplied voltage to the electrical lamp;

measuring, from the time that said voltage is supplied, the time difference between the time it takes the voltage output of said photo transistor to reach a predetermined voltage and the time it takes the supplied voltage to the electrical lamp to reach said predetermined voltage;

rejecting those lamps wherein the time difference is above a predetermined value.

* * * * *